United States Patent [19]
Gardner et al.

[11] Patent Number: 5,851,888
[45] Date of Patent: *Dec. 22, 1998

[54] CONTROLLED OXIDE GROWTH AND HIGHLY SELECTIVE ETCHBACK TECHNIQUE FOR FORMING ULTRA-THIN OXIDE

[75] Inventors: Mark I. Gardner, Cedar Creek; Mark C. Gilmer, Austin, both of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 784,195

[22] Filed: Jan. 15, 1997

[51] Int. Cl.$^6$ .......................... H01L 21/31; H01L 21/469
[52] U.S. Cl. ............................................ 438/301; 438/770
[58] Field of Search .................................... 438/770, 264, 438/769

[56] References Cited

U.S. PATENT DOCUMENTS

| | | |
|---|---|---|
| 4,776,925 | 10/1988 | Fossum et al. . |
| 4,897,368 | 1/1990 | Kobushi et al. . |
| 4,914,046 | 4/1990 | Tobin et al. . |
| 5,296,411 | 3/1994 | Gardner et al. .......................... 438/264 |
| 5,316,981 | 5/1994 | Gardner et al. .......................... 438/264 |
| 5,330,935 | 7/1994 | Dobuzinsky et al. . |
| 5,332,692 | 7/1994 | Saitoh . |
| 5,350,698 | 9/1994 | Huang et al. . |
| 5,360,769 | 11/1994 | Thakur et al. . |
| 5,397,720 | 3/1995 | Kwong et al. . |
| 5,468,974 | 11/1995 | Aronowitz et al. . |
| 5,538,923 | 7/1996 | Gardner et al. .......................... 438/264 |
| 5,541,141 | 7/1996 | Cho . |
| 5,567,638 | 10/1996 | Lin et al. . |
| 5,674,788 | 10/1997 | Wristers et al. . |

OTHER PUBLICATIONS

Wolf, Stanley, Ph.D., *Silicon Processing for the VLSI Era*, vol. 1: Process Technology, 1986, p. 183.
Wolf, Stanley, Ph.D., *Silicon Processing for the VLSI Era*, vol. 3: The Submicron Mosfet, 1995, p. 438.
Ghandhi, "VLSI Fabrication Principles: Silicon and Gallium Arsenide", pp. 639–642, 1994.

*Primary Examiner*—Richard A. Booth
*Attorney, Agent, or Firm*—Conley, Rose & Tayon; Robert C. Kowert; Kevin L. Daffer

[57] ABSTRACT

A method for fabrication a gate dielectric in which an initial dielectric layer comprising a sacrificial portion and a permanent portion is formed on the semiconductor substrate. Thereafter the sacrificial portion is controllably removed with an etchback process. The gate dielectric is preferably comprised of oxynitride to reduce boron penetration from the conductive gate into the transistor channel region and the gate dielectric has a final thickness less than approximately 30 angstroms. The method includes providing a semiconductor substrate having channel region that is laterally displaced between a pair of source/drain regions. An upper surface of said semiconductor substrate is then cleaned and the semiconductor substrate is loaded into an oxidation chamber containing a first ambient maintained at a first temperature for a first duration to grow an initial dielectric layer over the channel region of said semiconductor substrate. The first ambient includes a nitrogen bearing species, and the initial dielectric layer includes a sacrificial portion formed over a permanent portion. A gate dielectric is then formed by etching back the initial dielectric layer at a first etch rate to remove said sacrificial portion of the gate dielectric over the channel region. The gate dielectric is then annealed in an inert ambient maintained at an anneal temperature for an anneal duration. Thereafter, a conductive gate structure is formed on the gate dielectric aligned over the channel region of the semiconductor substrate and a pair of s/d structures are formed in a pair of s/d regions respectively of said semiconductor substrate. The pair of s/d regions are laterally displaced on either side of the channel region of the semiconductor substrate.

17 Claims, 2 Drawing Sheets

CONTROLLED OXIDE GROWTH AND HIGHLY SELECTIVE ETCHBACK TECHNIQUE FOR FORMING ULTRA-THIN OXIDE

BACKGROUND OF THE INVENTION

1. Field of the Invention

This invention relates to semiconductor fabrication and more particularly to a method of achieving an ultra-thin oxide with a controlled growth and highly selective etchback technique.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 micron, the limitations of conventional transistor processing become more apparent. To combat short channel effects in these transistors, the depth of the source/drain junctions and the thickness of the gate oxides must be reduced. Devices become more susceptible, however, to diffusion of electrically active impurities located in the conductive gate structure across the gate oxide and into the active area of the transistor as the gate oxide thickness decreases below 50 angstroms. The presence of these impurities within the channel region can undesirably alter the threshold voltage of the device. This problem is especially acute for boron implanted gate structures. In addition, thinner oxides increase concerns about hot carrier damage and oxide breakdown due, in part, to increased electrical fields within the transistor channel and across the gate dielectric. With respect to the latter, a 3 volt bias applied across a 50 angstrom gate oxide of an MOS transistor results in an electrical field of 6 x $10^6$ V/cm, which is considered to be an upper limit on the electrical field sustainable by a thermally formed $SiO_2$ film. See, e.g., 1 S. Wolf & R. Tauber, *Silicon Processing for the VLSI Era* 183 (Lattice Press 1986). Moreover, "cold" carrier tunneling becomes significant in gate dielectrics thinner than approximately 60 angstroms and, because of these tunneling effects, 30 angstroms has been reported as a lower limit for gate oxide thickness. See 3 S. Wolf at 438 (Lattice Press 1995).

In addition to reliability concerns, thin oxides present significant manufacturing challenges as well. The uniformity of the gate dielectric film across the wafer becomes more critical as the film thickness decreases. A 5 angstroms variation in film thickness across a wafer is far more significant in a 50 angstrom film than a 150 angstrom film. Greater control over oxide growth rates, uniformity, and etch rates is needed to insure that the thinner dielectric can be consistently reproduced in a manufacturing environment.

Despite the numerous problems noted, thin gate dielectrics are desirable because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit. Nitrogen bearing gate dielectrics including oxynitride gate dielectrics have been used to enhance the quality of thin (i.e., less than 100 angstroms) gate oxides and to reduce boron penetration. In Kwong (U.S. Pat. No. 5,397,720), for example, a method of forming an oxynitride gate dielectric is disclosed. The Kwong method consists essentially of growing an oxynitride layer in an $N_2O$ ambient and thereafter increasing the nitrogen concentration within the dielectric by introducing heated $NH_3$. Similarly, in Cho (U.S. Pat. No. 5,541,141), an oxynitride gate dielectric is grown with a 3-stage process. During the first and third phases, an $N_2O$ ambient is used. During the second phase, $NH_3$ is added to the $N_2O$ mixture to control the oxidation rate and the influx of nitrogen to the oxynitride film. While approaches such as those of Kwong and Cho address some the reliability issues associated with thin oxides, they do not address the manufacturing variability that prevents the consistent reproduction of high quality, ultra thin dielectric films.

Therefore, it would be highly desirable to fabricate ultra-thin MOS gate dielectrics that exhibited resistance to penetration of mobile carriers such as boron and improved quality characteristics over conventionally formed gate dielectrics with a consistently reproducible and manufacturable process.

SUMMARY OF THE INVENTION

The problems identified above are, in large part, addressed by a method for fabrication a gate dielectric in which an initial dielectric layer comprising a sacrificial portion and a permanent portion is formed on the semiconductor substrate. Thereafter the sacrificial portion is controllably removed with an etchback process. The gate dielectric is preferably comprised of oxynitride to reduce boron penetration from the conductive gate into the transistor channel region and the gate dielectric has a final thickness less than approximately 30 angstroms.

Broadly speaking, the present invention contemplates a method of forming a semiconductor transistor including providing a semiconductor substrate. The semiconductor substrate has a channel region which is laterally displaced between a pair of source/drain regions. An upper surface of said semiconductor substrate is then cleaned and the semiconductor substrate is loaded into an oxidation chamber containing a first ambient maintained at a first temperature for a first duration to grow an initial dielectric layer over the channel region of said semiconductor substrate. The first ambient includes a nitrogen bearing species, and the initial dielectric layer includes a sacrificial portion formed over a permanent portion. A gate dielectric is then formed by etching back the initial dielectric layer at a first etch rate to remove said sacrificial portion of the gate dielectric over the channel region. The gate dielectric is then annealed in an inert ambient maintained at an anneal temperature for an anneal duration. Thereafter, a conductive gate structure is formed on the gate dielectric aligned over the channel region of the semiconductor substrate and a pair of s/d structures are formed in a pair of s/d regions respectively of said semiconductor substrate. The pair of s/d regions are laterally displaced on either side of the channel region of the semiconductor substrate.

Preferably, the semiconductor substrate includes a p-type epitaxial layer formed on a p+ silicon bulk. A resistivity of the p-type epitaxial layer is preferably in the range of approximately 10 to 15 Ω-cm. The preferred cleaning process includes immersing the semiconductor substrate into an HF solution. The HF solution, in the preferred embodiment, includes ten parts $H_2O$ to one part HF. The semiconductor substrate is then immersed in an $H_2O:NH_4OH:H_2O_2$ solution maintained at approximately 65° to 80° C. for a duration in the range of approximately 5 to 15 minutes. A semiconductor substrate is then immersed into a $H_2O:HCl:H_2O_2$ solution maintained at a temperature in the range of approximately 65° to 80° C. for a duration in the range of approximately 5 to 15 minutes. The method may be carried out in an oxidation furnace or, alternatively, in a rapid thermal apparatus. The nitrogen bearing species preferably includes a gas of $NO, N_2O$ or $NH_3$. The first temperature is preferably in the range of approximately 300° to 850° C. and a thickness of the initial dielectric layer is preferably in the range of approximately 40 to 80 angstroms. A thickness of the gate dielectric is preferably in the range of approximately 10 to 20 angstroms. In the preferred embodiment, the first etch rate is approximately 30 angstroms per minute. The preferred method of etching back the initial dielectric layer includes immersing the semiconductor substrate into an etch solution preferably comprising $H_2O:HF$ in a ratio greater than or equal to approximately 100:1. A preferred inert ambient used for the process includes argon or $N_2$. The preferred anneal temperature is in the range of approximately 500° to 950° C.

The present invention further contemplates a transistor. The transistor includes a semiconductor substrate, a gate dielectric, a conductive gate, and a pair of source/drain structures. The semiconductor substrate includes a channel region laterally displaced between a pair of source/drain regions. The gate dielectric is formed on an upper surface of the semiconductor substrate over the channel region. A thickness of the gate dielectric is less than approximately 30 angstroms. The conductive gate structure is formed on the gate dielectric and aligned over the channel region of the semiconductor substrate. The pair of source/drain structures is formed within the pair of source/drain regions laterally displaced on either side of the channel region of the semiconductor substrate. The gate dielectric thickness is approximately constant over the channel region. In one embodiment, the gate dielectric consists of a permanent portion of an initial dielectric layer where the initial dielectric layer included a sacrificial portion formed over the permanent portion. In the presently preferred embodiment, a thickness of the permanent portion of the gate dielectric is in the range of approximately 10 to 20 angstroms. The gate dielectric preferably includes a nitrogen species such as oxynitride.

The present invention further contemplates a method of fabricating a semiconductor transistor in which a semiconductor substrate is provided and an initial dielectric is formed on an upper surface of the semiconductor substrate, the initial dielectric layer is etched back to form a conductive gate, the conductive gate is formed on the gate dielectric, and pair of source/drain structures is formed within the pair of source/drain regions. The semiconductor substrate includes a channel region laterally displaced between a pair of source/drain regions. The initial dielectric layer is formed on the semiconductor substrate over the channel region. The initial dielectric layer includes a sacrificial portion formed on a permanent portion. The etching back of the initial dielectric layer removes the sacrificial portion of the initial dielectric layer to form a gate dielectric. The gate dielectric consists of the permanent portion of the initial dielectric layer and is formed over the channel region of the semiconductor substrate. The conductive gate is formed on the gate dielectric and is aligned over the channel region of the semiconductor substrate.

The forming of the initial dielectric layer, in the preferred embodiment, is accomplished by thermally oxidizing the semiconductor substrate. Preferably, the thermal oxidation occurs in a nitrogen bearing ambient such that the initial dielectric layer is an oxynitride. A preferred thickness of the initial dielectric layer is in the range of approximately 40 to 80 angstroms. A thickness of the gate dielectric is preferably less than approximately 30 angstroms and still more preferably is in the range of approximately 10 to 20 angstroms.

BRIEF DESCRIPTION OF THE DRAWINGS

Other objects and advantages of the invention will become apparent upon reading the following detailed description and upon reference to the accompanying drawings in which.

Figure 1:
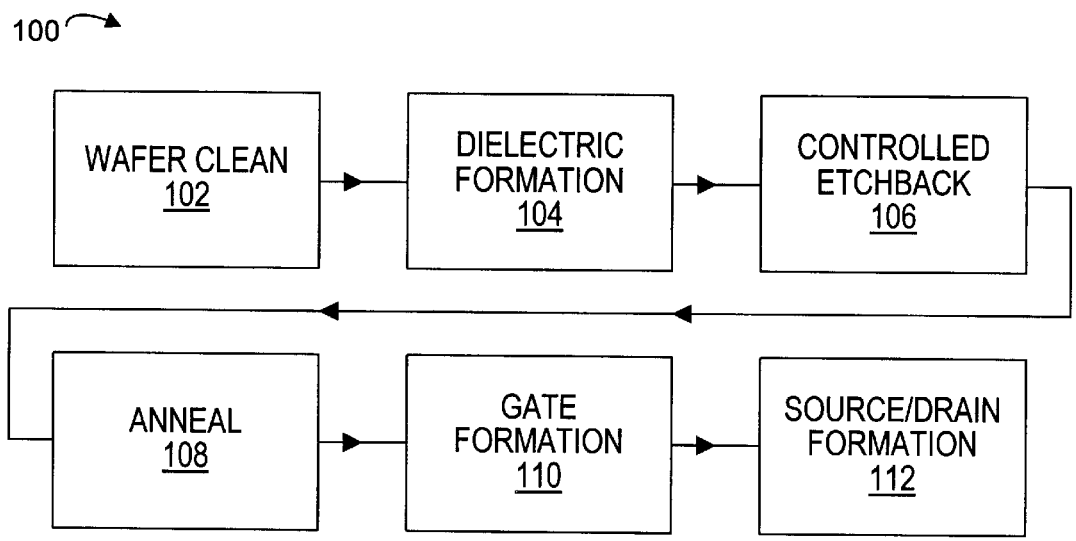
FIG. 1 is a flow diagram of a process for forming a semiconductor transistor in accordance with the present invention.

While the invention is susceptible to various modifications and alternative forms, the specific embodiments hereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 is a flow diagram depicting a preferred embodiment of a method for forming a semiconductor transistor. A semiconductor substrate is provided and cleaned in wafer clean 102. Preferably, the semiconductor substrate is a single crystal silicon type substrate. In a presently preferred embodiment, the semiconductor substrate includes a p-type epitaxial layer with a sheet resistivity of approximately 10 to 15 Ohms-cm formed on a p+ silicon bulk. The crystal orientation of the semiconductor substrate is preferably 100. Prior to the formation of the transistor, wafer clean 102 is performed to remove organic and other contaminants from an upper surface of the semiconductor substrate. In a presently preferred embodiment, wafer clean 102 includes the steps of immersing the semiconductor substrate in a 10:1 HF solution to remove any residual oxide from the semiconductor substrate. An RCA clean as is well known in the industry, is then performed. In a typical RCA clean, the semiconductor substrate is immersed in a solution of $H_2O$ - $NH_4OH$ - $H_2O_2$- in approximate ratio of 5:1:1 by volume. The solution is maintained at a preferred temperature of approximately 65° to 80° C. After 5 to 15 minutes in the solution, the semiconductor substrate is removed from the solution and rinsed in deionized water. Typically, the semiconductor substrate is then immersed for approximately 15 seconds into a 10:1 HF to remove any oxide formed during the first step. Next, the wafer is immersed in a solution of $H_2O$—HCl—$H_2O_2$ in an approximate ratio of 6:1:1 by volume heated to approximately 65° to 80° C. After 5 to 15 minutes in the HCI solution, the semiconductor substrate is rinsed, dried, and ready for subsequent processing. Further information regarding the standard RCA clean can be found in 1 Stanley Wolf and Richard N. Tauber, *Silicon Processing for the VLSI Era* 516–17 (Lattice Press 1986). Subsequent to wafer clean 102, dielectric formation 104 takes place. In the presently preferred embodiment, dielectric formation 104 is accomplished by loading the semiconductor substrate into an oxidation chamber. The oxidation chamber contains a first ambient maintained at a first temperature. The semiconductor substrate is immersed into the oxidation chamber for a first duration to grow an initial dielectric layer on the upper surface of the semiconductor substrate. The initial dielectric layer is grown at a first oxidation rate over the channel region of the semiconductor substrate. The first ambient preferably includes oxygen and a nitrogen bearing species such that the initial dielectric layer comprises an oxynitride. (For purposes of this disclosure, oxynitride is defined as an insulative material predominantly comprising silicon, oxygen, and nitrogen.) Ideally, the first temperature is in the range of approximately 300° to 850° C. such that the oxidation rate is relatively low. A preferred oxidation rate for the dielectric formation 104 is in the range of approximately 1 to 10 angstroms per minute so that adequate control can be maintain over the film thickness. It is theorized that the incorporation of nitrogen into the first ambient results in an oxidation process that produces a dielectric having a more uniform thickness across the semiconductor substrate than is obtainable with conventional oxidation cycles in which nitrogen is not used. It is further theorized that the subsequently formed oxynitride dielectric serves as an effective barrier to boron penetration from a conductive gate structure through the dielectric into the transistor channel region.

Dielectric formation 104 results in the formation of an initial dielectric layer upon the upper surface of the semiconductor substrate. The initial dielectric layer includes a sacrificial portion formed over a permanent portion as will be shown in greater detail with respect to FIGS. 2a through 2e. In the presently preferred embodiment, a thickness of the initial dielectric layer is in the range of approximately 40 to 80 angstroms and a thickness of the permanent portion is preferably less than approximately 30 angstroms. The thickness of the permanent portion is still more preferably in the range approximately 10 to 20 angstroms. Although conventional gate dielectrics were not thought to be functional at thicknesses less than approximately 30 angstroms due to tunneling effects, it is theorized that the presence of nitrogen in the gate dielectric increases the potential barrier and results in a lower probability and therefore, a lower occurrence of cold carrier tunneling.

Subsequent to dielectric formation 104, controlled etch back 106 is performed to remove the sacrificial portion of the initial dielectric layer. The present invention incorporates an overgrowth of the initial gate dielectric coupled with a controlled etch back to produce a manufacturable ultra thin gate oxide. In the preferred embodiment, the controlled etch back 106 is accomplished by immersing the semiconductor substrate into an etch solution. To achieve maximum control over the final film thickness, the controlled etch back is preferably carried out using an etch solution of $H_2O$ and HF in relative concentrations by volume of greater than approximately 100 to 1. Using such a solution, etch rates of 30 angstroms per minute or less are thought to be achievable. This relatively low etch rate facilitates maximum control over the final thickness of the gate dielectric.

After controlled etch back 106 is performed, anneal step 108 is performed. In a presently preferred embodiment, anneal 108 is carried out by immersing the semiconductor substrate into an inert ambient maintained at a temperature of approximately 500° to 950° C. for a duration of approximately 30 seconds to 20 minutes in Argon or $N_2$.

After the formation and annealing of the gate dielectric, gate formation 110 and source/drain formation 112 are performed to complete the semiconductor transistor. In one embodiment of gate formation 110, polysilicon is deposited in a chemical vapor deposition chamber reactor at a temperature of approximately 500° to 650° C. at a temperature less than approximately 2 torrs. The deposited polysilicon is subsequently doped either through a diffusion step or with an implant step. The doping is ideally sufficient to reduce the sheet resistivity of the polysilicon to less than approximately 500 $\Omega$/square. After deposition, the polysilicon is patterned with a conventional photolithography/etch process. The formation of the conductive gate structure prior to the formation of the source/drain structure ensures that the conductive gate structure will be aligned over the channel region of the semiconductor substrate. In an alternative embodiment, the conductive gate is a metal such as aluminum, copper, tungsten, or an appropriate alloy thereof Source drain structures are formed after the formation of the conductive gate structure typically through the use of an ion implantation process in which a source/drain impurity distribution is introduced into the source/drain regions laterally displaced on either side of the channel region of the semiconductor substrate. During this process, the conductive gate structure serves to block the implant species from being introduced into the channel region of the semiconductor substrate. For n-channel transistors, the source/drain implantation is carried out using an n-type impurity distribution such as phosphorous or arsenic while, for p-channel transistors, the preferred implant species is boron.

Figure 2A:
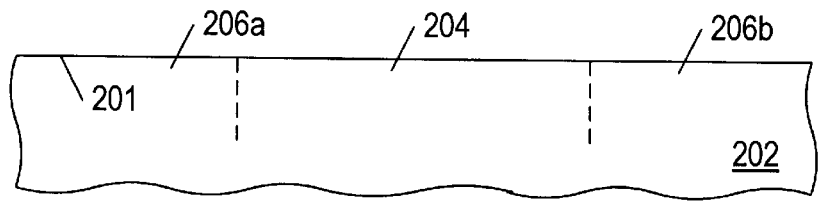
FIG. 2a is a partial cross-sectional view of a semiconductor substrate including a channel region between a pair of source/drain regions.
Figure 2B:
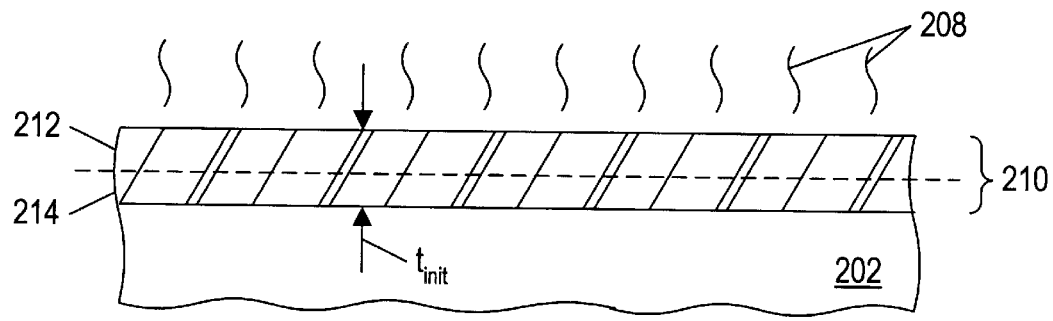
FIG. 2b is a processing step subsequent to FIG. 2a in which an initial dielectric layer has been formed on an upper surface of the semiconductor substrate.
Figure 2C:
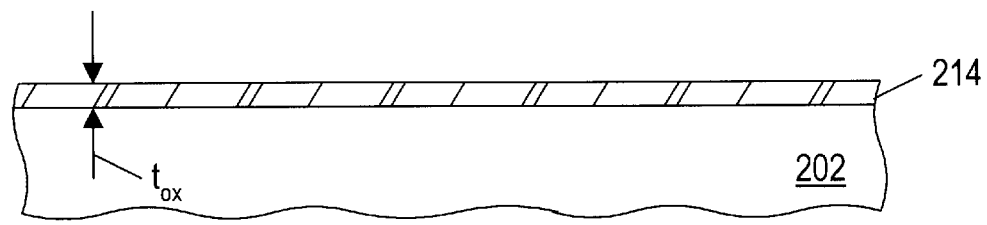
FIG. 2c is a processing step subsequent to FIG. 2b in which the initial dielectric layer has been etched back to form a gate dielectric.
Figure 2D:
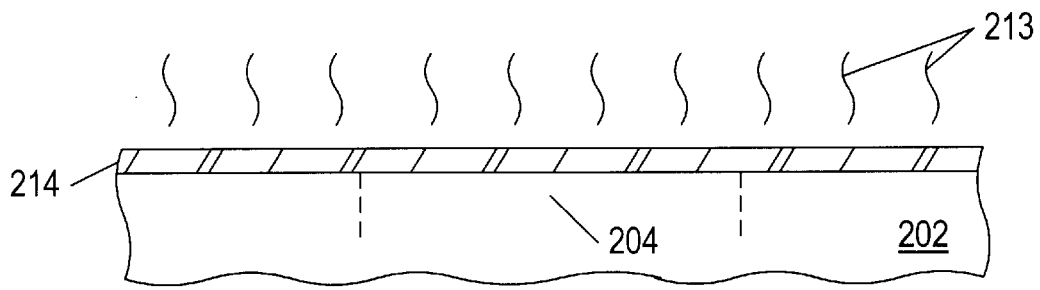
FIG. 2d is a processing step subsequent to FIG. 2c in which the gate dielectric is annealed.

Turning now to FIGS. 2a through 2e, the process sequence for forming transistor 200 (shown in FIG. 2e) is shown in greater detail. In FIG. 2a, semiconductor substrate 202 is provided. Semiconductor substrate 202 includes channel region 204 laterally displaced between a pair of source/drain regions 206a and 206b. As noted previously, semiconductor substrate 202 comprises, in the preferred embodiment, a single crystal silicon substrate with a 100 orientation. Preferably, semiconductor substrate 202 includes a p-type epitaxial layer with a resistivity of approximately 10 to 15 $\Omega$-cm. Semiconductor substrate 202 includes a channel region 204 laterally displaced between a pair of source/drain regions 206a and 206b. Turning to FIG. 2b, an initial dielectric layer 210 is formed on upper surface 201 of semiconductor substrate 202. The formation of initial dielectric layer 210 is preferably accomplished with thermal oxidation represented in FIG. 2b as reference numeral 208. Ideally, thermal oxidation 208 is carried out in a nitrogen bearing ambient so that initial dielectric layer 210 is an oxynitride. Initial dielectric layer 210 includes sacrificial portion 212 formed upon permanent portion 214. The initial thickness $t_{init}$ is between 40 to 80 angstroms in the presently preferred embodiment. Thermal oxidation 208 is carried out as described previously with respect to dielectric formation 104. In FIG. 2c, sacrificial portion 212 of initial dielectric layer 210 has been removed leaving behind the permanent portion 214 which serves as gate dielectric 214. Gate dielectric 214 has a thickness $t_{ox}$ that is preferably less than approximately 30 angstroms. In the presently preferred embodiment, $t_{ox}$ is in the range of approximately 10 to 20 angstroms. FIG. 2d depicts gate dielectric 214 receiving anneal 213 as discussed previously with respect to reference numeral 108 in FIG. 1.

Figure 2E:
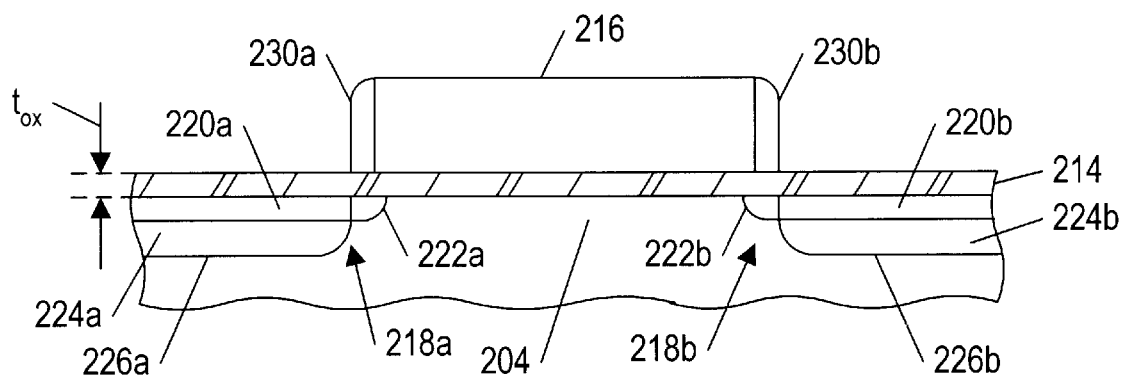
FIG. 2e is a processing step subsequent to FIG. 2d in which the conductive gate has been formed on the gate dielectric and a pair of source/drain structures has been formed within source/drain regions of the semiconductor substrate.

FIG. 2e depicts transistor 200. Transistor 200 includes a semiconductor substrate 202 which includes a channel region 204 laterally displaced between a pair of source/drain regions 206a and 206b. Gate dielectric 214 is formed on upper surface 201 of semiconductor 202. A thickness toX of gate dielectric 214 is less than approximately 30 angstroms and, in a presently preferred embodiment, is in the range of approximately 10 to 20 angstroms. Ideally, oxynitride is used to form gate dielectric 214. Accordingly, gate dielectric 214 includes a nitrogen distribution. As previously discussed, gate dielectric 214, in a presently preferred embodiment, consists of a permanent portion of an initial dielectric layer (shown in FIG. 2b as reference numeral 210). A sacrificial portion 212 of initial dielectric layer 210 has been removed.

Transistor 200 further includes conductive gate 216. Conductive gate 216 is preferably formed of polysilicon having a sheet resistivity less than approximately 500 Ω/square. Alternatively, conductive gate 216 may comprise a metal such as aluminum, copper, tungsten, or an appropriate alloy thereof. Conductive gate 216 is aligned over channel region 204 of semiconductor substrate 202. Transistor 200 further includes a first source/drain structure 218a and a second source/drain structure 218b. The source/drain structure 218 are respectively located within source/drain regions 206 of semiconductor substrate 202. In the embodiment shown in FIG. 2e, each source/drain structure 218 includes a lightly doped impurity distribution 220 substantially contained within a lightly doped region 222 and a heavily doped impurity distribution 224 substantially contained within a heavily doped region 226. In conjunction with the presence of lightly doped source/drain regions, the embodiment of transistor 200 shown in FIG. 2e further includes spacer structures 230a and 230b formed on respective sidewalls of conductive gate 216. As seen in the drawing of FIGS. 2c through 2e, a thickness $t_{ox}$ of gate dielectric 214 is essentially constant over the entire channel region 204 of semiconductor substrate 202. The ultra thin gate dielectric represented by gate dielectric 214 represents a breakthrough in the formation of thin dielectric transistors and facilitates commensurate miniturization of the semiconductor transistor.

It will be apparent to those skilled in the art having the benefit of this disclosure that the present invention contemplates a method and structure for achieving ultra thin gate dielectrics in an MOS transistor. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method of forming a semiconductor transistor including:
    providing a semiconductor substrate, wherein said semiconductor substrate comprises a channel region laterally displaced between a pair of source/drain regions;
    cleaning an upper surface of said semiconductor substrate;
    loading said semiconductor substrate into an oxidation chamber comprising a first ambient maintained at a first temperature for a first duration to grow an initial dielectric layer at a first oxidation rate over said channel region of said semiconductor substrate, wherein said first ambient comprises a nitrogen bearing species, and wherein said initial dielectric layer comprises a sacrificial portion, and wherein said initial dielectric layer has a thickness in the range of approximately 40 to 80 angstroms;
    forming a gate dielectric by etching back said initial dielectric layer at a first etch rate to remove said sacrificial portion of said initial dielectric over said channel region, wherein said gate dielectric has a first thickness of less than approximately 30 angstroms after said etching back, and wherein said etching back is carried out using an etch solution comprising $H_2O$ and an etchant in relative concentrations by volume of greater than approximately 100 to 1;
    annealing said gate dielectric in an inert ambient maintained at an anneal temperature for an anneal duration;
    forming a conductive gate structure on said gate dielectric having approximately said first thickness, wherein said conductive gate structure is aligned over said channel region of said semiconductor substrate; and
    forming a pair of s/d structures in a pair of s/d regions respectively, wherein said s/d regions are laterally displaced within said semiconductor substrate on either side of said channel region.

2. The method of claim 1, wherein said semiconductor substrate includes a p-type epitaxial layer formed on a p+silicon bulk, and wherein a resistivity of said p-type epitaxial layer is in the range of approximately 10 to 15 Ω-cm.

3. The method of claim 1 wherein said cleaning comprises:
    immersing said semiconductor substrate into a 10:1 HF solution;
    immersing said semiconductor substrate into an $H_2O:NH_4OH:H_2O_2$ solution maintained at 65° to 80° C. for a duration in the range of approximately 5 to 15 minutes; and
    immersing said semiconductor substrate into a $H_2O:HCl:H_2O_2$ solution maintained
    at a temperature in the range of approximately 65° to 80° C. for a duration in the range of approximately 5 to 15 minutes.

4. The method of claim 1 wherein said oxidation chamber comprises an oxidation furnace.

5. The method of claim 1 wherein said oxidation chamber comprises a rapid thermal apparatus chamber.

6. The process of claim 1 wherein said nitrogen bearing species comprises a gas selected from the group consisting of NO, $N_2O$, and $NH_3$.

7. The process of claim 1 wherein said first temperature is in the range of approximately 300° to 850° C.

8. The process of claim 1 wherein said first thickness is approximately 10 to 20 angstroms.

9. The process of claim 1 wherein said first etch rate is approximately 30 angstroms/minute.

10. The process of claim 1 wherein said inert ambient comprises a gas selected from the group consisting of Argon and $N_2$.

11. The process of claim 1 wherein said anneal temperature is in the range of approximately 500° to 950° C.

12. A method of fabricating a semiconductor transistor comprising:

providing a semiconductor substrate, wherein said semiconductor substrate includes a channel region laterally displaced between a pair of source/drain regions;

forming an initial dielectric layer having a thickness in the range of approximately 40 to 80 angstroms on an upper surface of said semiconductor substrate over said channel region, said initial dielectric layer comprising a sacrificial portion formed on a permanent portion;

etching back said initial dielectric layer to remove said sacrificial portion wherein a gate dielectric consisting of said permanent portion of said initial dielectric layer and having a thickness less than approximately 30 angstroms is formed over said channel region of said semiconductor substrate, forming a conductive gate structure on said gate dielectric, wherein said conductive gate structure is aligned over said channel region of said semiconductor substrate; and forming a pair of source/drain structures within said pair of source/drain regions.

13. The method of claim 12 wherein the step of forming said initial dielectric layer comprises thermally oxidizing said semiconductor substrate.

14. The method of claim 13 said thermally oxidizing occurs in a nitrogen bearing ambient such that said initial gate dielectric comprises oxynitride.

15. The method as recited in claim 12 wherein said thickness of said gate dielectric is in the range of approximately 10 to 20 angstroms.

16. The method of claim 15 wherein said gate dielectric comprises oxynitride.

17. The method as recited in claim 12, wherein said etching back is carried out using an etch solution comprising $H_2O$ and an etchant in relative concentrations by volume of greater than approximately 100 to 1.

* * * * *